US006884953B2

(12) United States Patent
Nii et al.

(10) Patent No.: US 6,884,953 B2
(45) Date of Patent: Apr. 26, 2005

(54) SWITCHING CIRCUIT

(75) Inventors: Yoshibide Nii, Anjo (JP); Naohiko Hirano, Okazaki (JP)

(73) Assignees: Toyota Jidosha Kabushiki Kaisha, Toyota (JP); Denso Corporation, Kariya (JP)

( * ) Notice: Subject to any disclaimer, the term of this patent is extended or adjusted under 35 U.S.C. 154(b) by 295 days.

(21) Appl. No.: 10/160,046

(22) Filed: Jun. 4, 2002

(65) Prior Publication Data

US 2003/0001438 A1 Jan. 2, 2003

(30) Foreign Application Priority Data

Jun. 15, 2001 (JP) ........................................ 2001-181345

(51) Int. Cl.[7] ........................ H01H 13/04; H01H 13/08
(52) U.S. Cl. .................... 200/294; 200/297; 174/149 B
(58) Field of Search ................................ 200/294, 297, 200/1 R, 51.03, 238; 174/70 B, 99 B, 149 B

(56) References Cited

U.S. PATENT DOCUMENTS

| 3,678,422 | A | * | 7/1972 | Reimer | 335/112 |
| 3,956,574 | A | * | 5/1976 | Weimer | 174/68.2 |
| 3,961,129 | A | * | 6/1976 | Gehrs et al. | 174/72 B |
| 4,423,336 | A | * | 12/1983 | Iverson et al. | 307/64 |
| 4,739,441 | A | * | 4/1988 | Galletly | 361/611 |
| 5,067,043 | A | * | 11/1991 | Markowski et al. | 361/650 |
| 6,034,861 | A | * | 3/2000 | Meiners et al. | 361/115 |
| 6,176,720 | B1 | * | 1/2001 | Johnson | 439/213 |
| 6,278,179 | B1 | | 8/2001 | Mermet-Guyennet | |
| 6,326,567 | B1 | * | 12/2001 | Sciarra | 200/48 V |
| 6,407,336 | B1 | * | 6/2002 | Jakob et al. | 174/70 B |

FOREIGN PATENT DOCUMENTS

| JP | (A) 11-113244 | 4/1999 |
| KR | 2000-0035704 | 6/2000 |

* cited by examiner

Primary Examiner—Kyung Lee
(74) Attorney, Agent, or Firm—Kenyon & Kenyon

(57) ABSTRACT

In a switching circuit, at least two bus bars are fixed with an insulator interposed therebetween and secured to a substrate of the switching circuit. Being combined with the bus bars, the insulator serves not only to insulate those bus bars but also to enhance the bending rigidity and bending strength of the switching circuit. As current flows in one of the bus bars in a direction opposite to a direction in which current flows in the other bus bar, the inductance of the bus bars is reduced, resulting in the decreased fly-back voltage generated upon switching operation.

9 Claims, 7 Drawing Sheets

SWITCHING CIRCUIT

INCORPORATION BY REFERENCE

The disclosure of Japanese Patent Application No.2001-181345 filed on Jun. 15, 2001, including the specification, drawings and abstract are incorporated herein by reference in its entirety.

BACKGROUND OF THE INVENTION

1. Field of Invention

The invention relates to a switching circuit provided with a plurality of bus bars serving as a conductor for coupling a switching element to a power source or a load.

2. Description of Related Art

Generally a metallic bus bar is well known as a conductor having a cross section area large enough to allow electric current to flow between circuit elements or between a circuit element and a power source or between a circuit element and a load in a power circuit such as a switching circuit for an inverter motor. FIG. 8 is a circuit diagram showing a generally employed switching circuit 40 serving as an inverter. FIG. 9 shows a plan view of the switching circuit 40.

Referring to FIG. 8, the switching circuit 40 takes the form of a three-phase inverter having switching elements S1 to S6, such as IGBT (Insulated Gate Bipolar Transistor), and diodes D1 to D6 connected in parallel with the corresponding switching elements S1 to S6. Each of the switching elements S1 to S6 is opened and closed in accordance with a control signal sent from a control unit (not shown). In response to opening or closing of the switching elements S1 to S6, the direct current applied from a direct-current power source 42 is converted into a three-phase alternating current. The three-phase alternating current, then, is supplied to a three-phase inverter motor 44 serving as the load.

Referring to FIG. 9, the switching circuit 40 has power source side bus bars 46 (46P, 46N) between the switching elements S1 to S6 and the power source (not shown), and has load side bus bars 48 (48U, 48V, 48W) between the switching elements S1 to S6 and the respective phases (U-phase, V-phase, W-phase) at the load side. Each of the power source side bus bars 46 is formed into a frame-like shape defined by longitudinal members 46C and lateral members 46R. The longitudinal members 46C are inserted into a substrate 50, which is then subjected to resin molding, so that the longitudinal members 46C are embedded in the substrate 50. Like the longitudinal members 46C, the lateral members 46R are embedded in the substrate 50 except the upper surface. The upper surface of the lateral member 46R is exposed on the substrate 50 as a surface to which wires are bonded for connection with the switching elements S1 to S6. Embedding of the bus bars 46P and 46N in the substrate 50 makes it possible to enhance a flexural rigidity and flexural strength of the switching circuit 40. Furthermore, insulation between adjacent bus bars, for example, bus bars 46P and 46N, or the bus bars 46P, 46N and 48U, 48V, 48W can be secured, respectively.

Each of the load-side bus bars 48 is formed as a strip member that laterally extends on the substrate 50. The switching members S1 to S6 are provided on the substrate 50 between the lateral members 46R of the power source side bus bars 46 and the load side bus bars 48. The respective ends, upper and lower ends shown in FIG. 9, of the switching members S1 to S6 are connected to the lateral members 46R and the load-side bus bars 48 via wires 52.

The wires 52 are bonded to the respective bus bars 46, 48 through ultrasonic bonding. More specifically, in the state where the metallic wires are pressed onto the bus bars 46, 48, each portion of contacts between the metallic wires and the bus bars 46, 48 is oscillated using ultrasound. Accordingly the wires 52 are bonded onto the surface of the bus bars 46, 48.

However, the aforementioned switching circuit formed by insert-molding of the bus bars (power source side) into the substrate has caused various problems. For example, as a flow path of the resin becomes complicated during the insert molding, the resultant switching circuit may be deformed or cracked. Furthermore the inserted bus bars may be deformed by the temperature rise during the resin molding.

Conventionally, adjacent bus bars are kept insulated by inserting the bus bars into an insulating resin, that is, covering the peripheral area of the bus bars with the resin material. However, this may increase the size of the substrate.

When a certain failure occurs during resin molding of the substrate, a gap may be generated in a portion of the substrate on which the lateral member of the inserted bus bar (46R shown in FIG. 9, for example) abuts. This may prevent the bus bars from being insulated, or cause difference in the oscillating state or the temperature rise during ultrasonic bonding between the portion with the gap and the portion with no gap. As a result, the bonding strength or the resistance value may vary depending on the bonded portion.

SUMMARY OF THE INVENTION

A switching circuit according to an embodiment of the invention includes a plurality of switching elements and a plurality of bus bars each serving as a conductor. The bus bars connect the switching elements to one of a power source and a load. Two or more of the plurality of bus bars are fixed to each other with an insulator interposed between adjacent ones of the two or more bus bars. The two or more of the plurality of bus bars with the insulator interposed therebetween are secured to a substrate of the switching circuit. As the aforementioned circuit requires no insert molding of the bus bars, the process for producing the switching circuit may be simplified, reducing the time and cost for producing the circuit. As the resin used for producing the circuit can be reduced, the resultant circuit may be compact and light. A plurality of bus bars are fixed with insulators interposed therebetween, thus preventing deformation of the bus bar itself. Furthermore, the combined bus bars and the insulators may serve as a reinforcing member of the substrate. Accordingly, the flexural rigidity and flexural strength of the switching circuit can be enhanced.

Two of the plurality of bus bars are fixed to each other with the insulator interposed therebetween. Current flows in one of the two bus bars in a direction opposite to a direction in which current flows in the other bus bar. In the switching circuit provided with the bus bars, an induced voltage (fly-back) generated during switching is increased by inductance distributed in the bus bars. This may prevent the switching circuit from conducting high-speed switching. According to the aforementioned aspect of the invention, however, the magnetic fields generated around the adjacent bus bars can be offset by current flowing along the bus bar in the opposite directions. The inductance of the bus bars, thus, can be reduced.

DETAILED DESCRIPTION OF PREFERRED EMBODIMENTS

Figure 1:
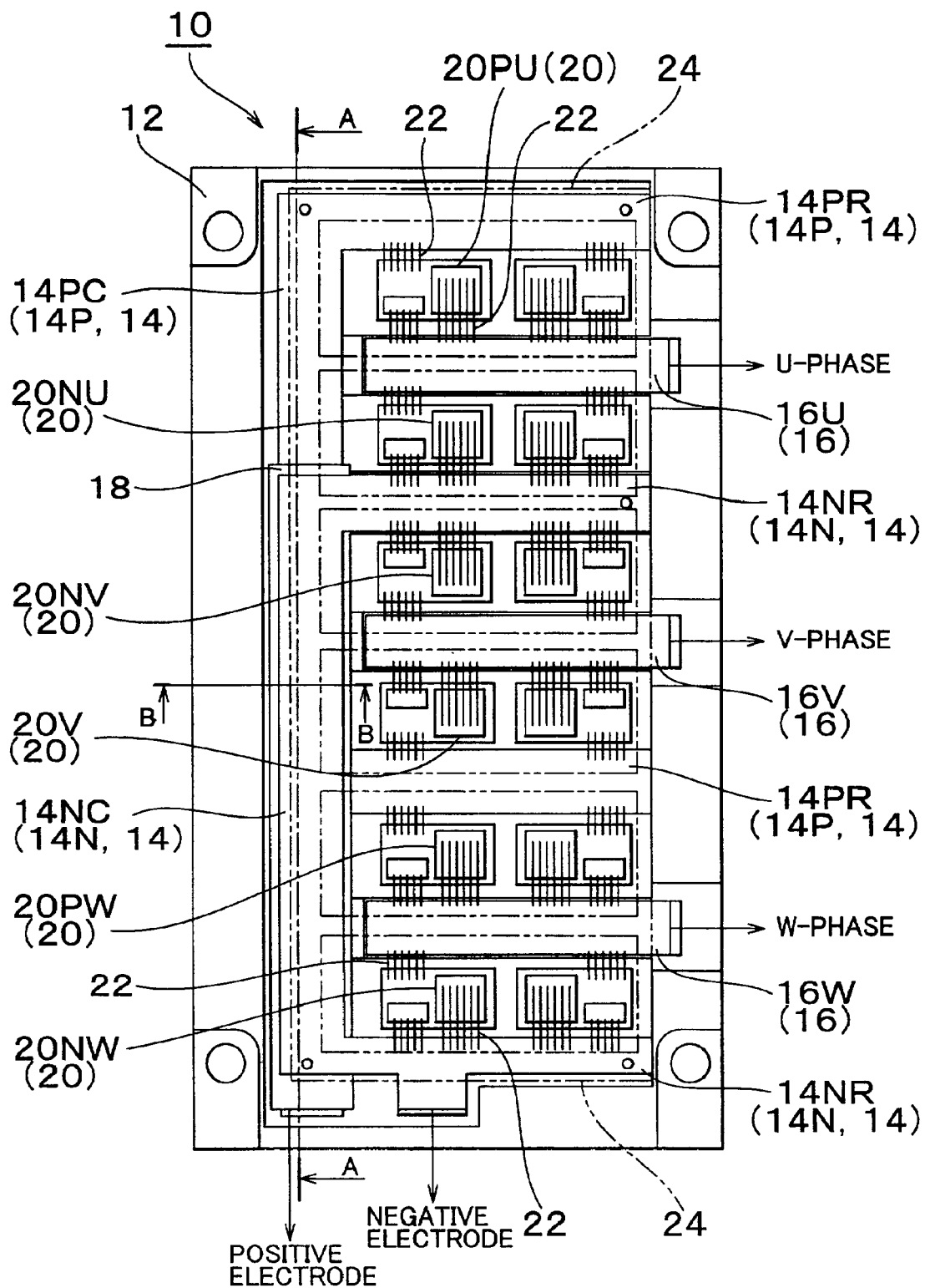
FIG. 1 is a plan view of a switching circuit of an embodiment of the invention.

Embodiments of the invention will be described referring to the drawings. FIG. 1 is a plan view showing an essential portion of a switching circuit 10 of an embodiment of the invention. The direction of y-axis in figure such as FIG. 1 will be hereinafter called as a longitudinal direction, and the direction of x-axis in the figure will be hereinafter called as a lateral direction.

Figure 6:
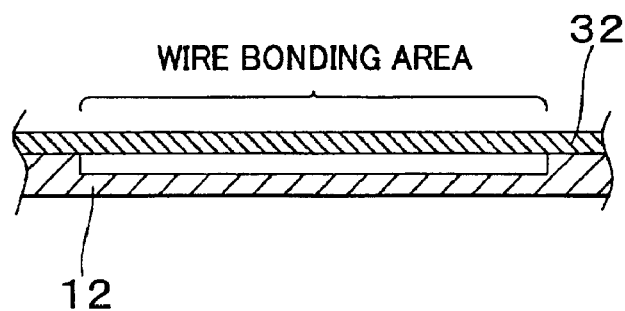
FIG. 6 is a side elevation view illustrating a portion to which wire bonding is performed on the bus bar of the switching circuit.

The switching circuit 10 serves to convert direct current into three-phase current (U-phase, V-phase, W-phase) as a circuit equivalent to an inverter as shown in FIG. 6. Referring to FIG. 1, the switching circuit 10 includes a plurality of bus bars 14 (14P, 14N) connected to a power source (not shown), and a plurality of bus bars (16U, 16V, 16W) connected to a load (not shown). The bus bar 14 includes longitudinal members 14PC, 14NC that extend in the longitudinal direction, and lateral members 14PR, 14NR that extend in the lateral direction. Each bus bar 16 is formed into a strip-like shape extending in the lateral direction. The lateral members 14PR, 14NR and the bus bars 16 are arranged in parallel at predetermined intervals. In FIG. 1, arranged in order from the upper side to lower side along the y-axis direction of the figure are the lateral member 14PR of the positive electrode side bus bar 14P, the U-phase side bus bar 16U, the lateral member 14NR of the negative electrode side bus bar 14P, the V-phase side bus bar 16V, the lateral member 14PR of the positive electrode side bus bar 14P, the W-phase side bus bar 16W, and the lateral member 14NR of the negative electrode side bus bar 14N, respectively. The longitudinal member 14PC of the positive electrode side bus bar 14P and the longitudinal member 14NC of the negative electrode side bus bar 14C are stacked via an insulator 18 in the direction vertical to the switching circuit. The stacked structure will be described in detail later. Each of the aforementioned bus bars 14, 16 may be formed of a metallic member, for example, copper. The insulator 18 is formed of, for example, PPS (polyphenylene sulfide), PBT (polybutyleneterephthalate) or the like.

Switching elements 20 are disposed on gaps between the lateral member 14PR and the bus bar 16 and between the lateral member 14NR and the bus bar 16. Referring to FIG. 1, arranged in order from the upper side to the lower side of the switching circuit in the figure are a switching element 20PU between the positive electrode and the U-electrode at load side, a switching element 20NU between the negative electrode and the U-electrode at load side, a switching element 20NV between the negative electrode and the V-electrode at load side, a switching element 20PV between the positive electrode and the V-electrode at load side, a switching element 20PW between the positive electrode and the W-electrode at load side, and a switching element 20NW between the negative electrode and the W-electrode at load side.

Each of the switching elements 20 is connected to the bus bars 14, 16 via wires 22 bonded to the bus bars 14, 16 through ultrasonic bonding. In this embodiment, each rear surface of the bus bars 14, 16 is brought into tight contact with an upper surface of a substrate 12. Rear surfaces of the bus bars 14, 16 and the upper surface of the substrate 12 are formed into flat faces. Then adhesive is applied to the whole flat faces of the rear surfaces of the bus bars 14, 16 and the upper surface of the substrate so as to be bonded. This makes it possible to make a state of contact between the bus bars 14, 16 and the substrate 12 uniform, and an oscillating state and the temperature rise caused by ultrasonic bonding uniform. Accordingly, variation in the state of contact between the wire 22 and the bus bars 14, 16 may further be reduced.

Provided on the bus bars 14, 16 are control terminal bases 24 (shown in dashed line) each formed of a thin frame-like resin having an opening above the switching element 20 and a bonding position. The switching element 20 is connected to a control terminal (not shown) provided on the control terminal base 24 via a wire (not shown). Opening and closing of the switching element 20 is controlled in accordance with a control signal sent from a control unit (not shown) via the control terminal and the wire.

Figure 2:
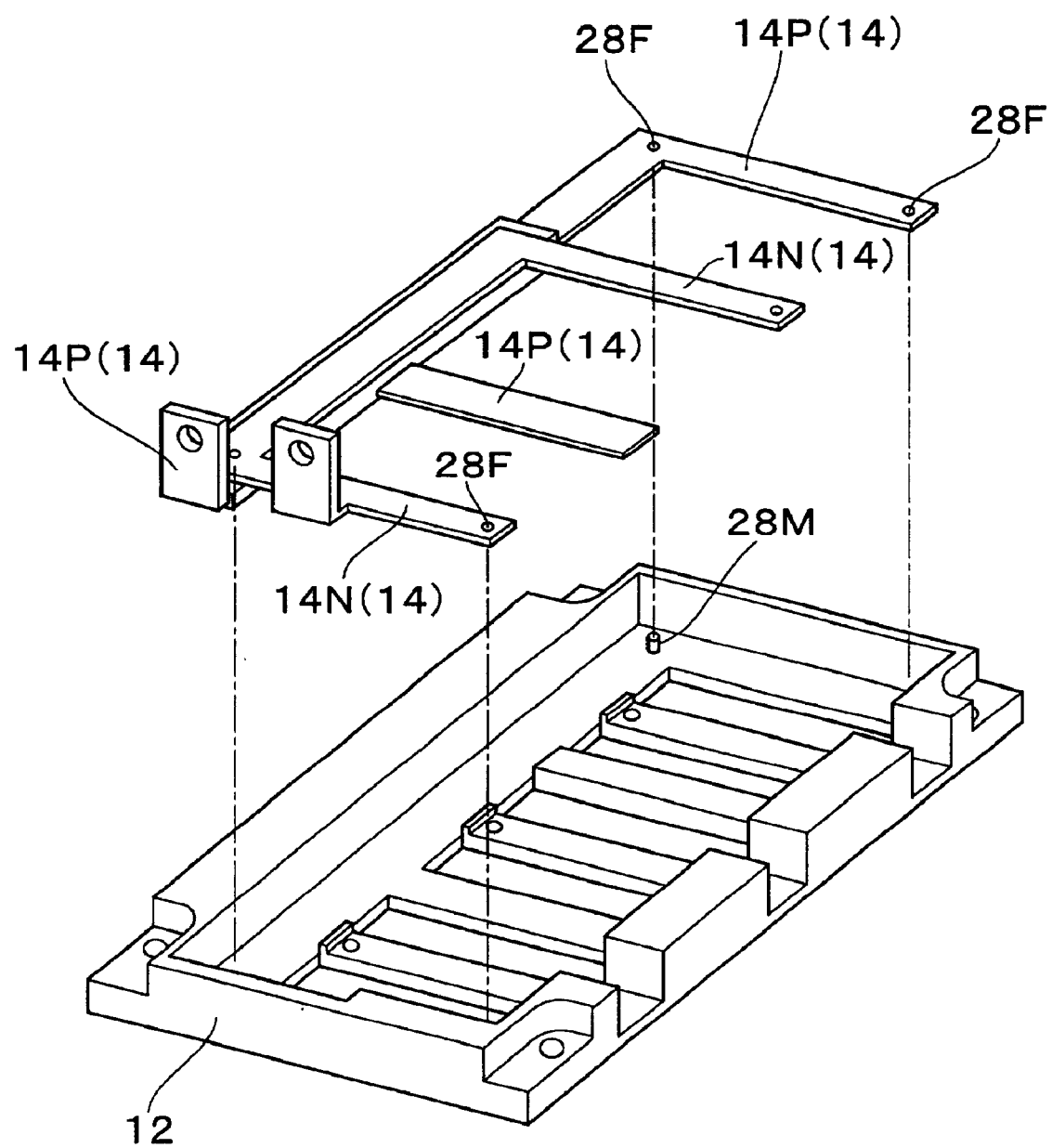
FIG. 2 is a perspective view of the switching circuit illustrating how electrode-side bus bars and insulators are fixed to a substrate of the switching circuit.
Figure 3:
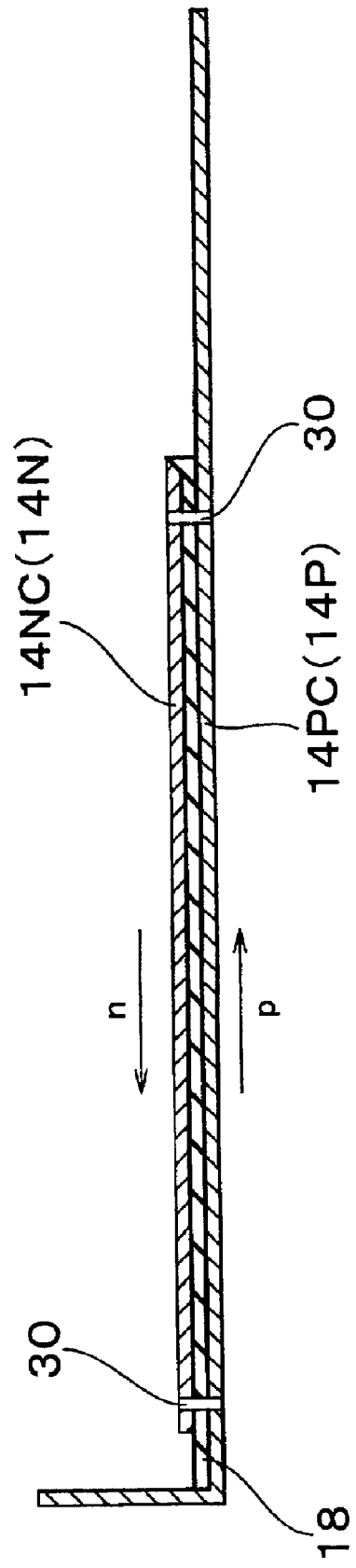
FIG. 3 is a sectional view along line A—A of FIG. 1, illustrating a cross-section of the electrode-side bus bar of the switching circuit.
Figure 4:
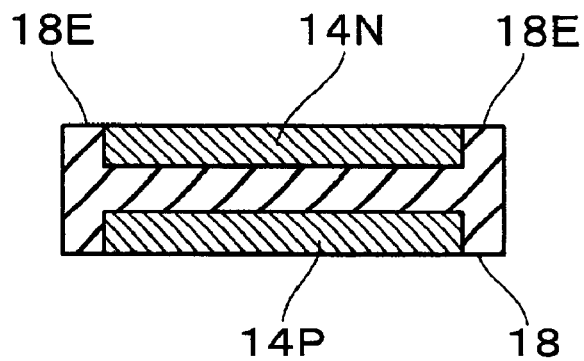
FIG. 4 is a sectional view along line B—B of FIG. 1, illustrating another cross-section of the electrode-side bus bar of the switching circuit.

Referring to FIGS. 2 to 4, the description about assembling of the bus bars 14 and the insulator 18 to the substrate 12, and the structure of the assembly will be explained in detail. FIG. 2 is a perspective view showing assembling of the bus bars 14 and the insulator 18 to the substrate 12. FIG. 3 is a sectional view along line A—A of FIG. 1, illustrating a section of the power source-side bus bar of the switching circuit. FIG. 4 is a sectional view along line B—B of FIG. 1, illustrating another section of the power source-side bus bar of the switching circuit.

Referring to FIG. 2, a plurality of bus bars (two bus bars 14P, 14N in this embodiment) are fixed to the substrate 12 in the state where the insulator 18 is interposed between the bus bars 14P and 14N. In this embodiment, a plurality of positioning pins 28M provided on the upper surface of the substrate 12 are inserted into corresponding holes 28F formed on the bus bars 14 such that the bus bars 14 are positioned with respect to the substrate 12. The surface of the substrate 12 on which the bus bars 14 abut is applied with the adhesive so that the bus bars 14 are adhered to the substrate 12.

Referring to FIG. 3, the insulator 18 is interposed between the longitudinal member 14NC of the negative electrode side bus bar 14N as the upper side and the longitudinal member 14PC of the positive electrode side bus bar 14P as the lower side. The insulator 18 serves to prevent electric current from flowing between the bus bars 14P and 14N. Positions of the bus bars 14P and 14N are aligned with a positioning pin 30 that is formed of the insulating material and inserted into the insulator 18. The bus bars 14P, 14N and the insulator 18 are adhered with the adhesive. Referring to FIG. 4, both ends of the insulator 18 are provided with protrusions 18E, 18E each extending vertically in an opposite direction with respect to the insulator 18. The positive electrode-side bus bar 14P and the negative electrode-side bus-bar 14N are fitted in the portion above and below the isolator 18. Accordingly the protrusions 18E, 18E serve to align positions of the bus bars 14P, 14N.

In the aforementioned structure of the bus bars 14P, 14N having the insulator 18 interposed therebetween, the direction of electric current that flows through the bus bar 14P is different from that of electric current flowing through the bus bar 14N. In the embodiment, the aforementioned bus bars 14P and 14N are structured to extend in the same direction (longitudinal direction) so as to be connected to the power source at the same side (left side in FIG. 3, lower side in FIG. 1). As a result, the electric current flows through the negative electrode side bus bar 14N in the direction designated as n (from right to left), and the electric current flows through the positive electrode side bus bar 14P in the direction designated as p (from left to right). The magnetic field generated around the bus bar 14P has a rotating direction opposite to that of the magnetic field generated around the bus bar 14N. The aforementioned structure may reduce inductance generated in the bus bars 14P, 14N, thus minimizing fly-back voltage upon switching. Accordingly this may realize higher switching speed.

The invention is not limited by the aforementioned embodiment in which one insulator is interposed between two bus bars over a whole length of those bus bars. Alternatively, the insulator may be interposed between two bus bars only partially, or a plurality of insulators are intermittently interposed between the bus bars.

Figure 5:
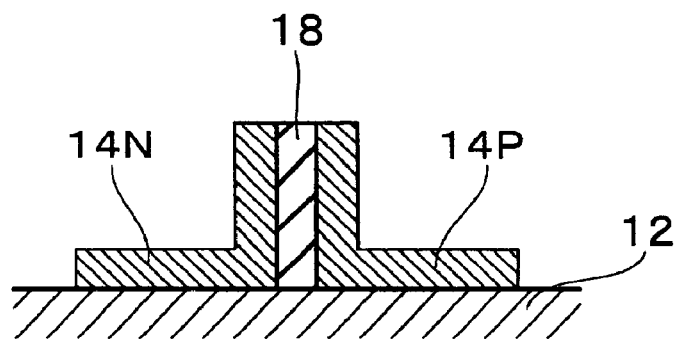
FIG. 5 is a sectional view illustrating bus bars and insulators of the switching circuit according to another embodiment of the invention.

In the embodiment, a plurality of bus bars are stacked on the substrate via the insulator in a vertical direction thereto. Alternatively, the bus bars 14P, 14N may be arranged on the substrate in parallel via the insulator 18 as shown in FIG. 5. In this case, the second moment of area of the bus bar may be enhanced by forming the section of the bus bar into an L-like shape so as to improve flexural rigidity and flexural strength.

In the aforementioned embodiment, each rear surface of the bus bars (14PR, 14NR, 16U, 16V or 16W) subjected to the ultrasonic bonding is brought into tight contact with the upper surface of the substrate 12. Alternatively, as shown in FIG. 6, the bus bar 32 may have portions that are not subjected to the ultrasonic bonding, for example, both ends of the bus bar 32, supported with the substrate 12 so as to form a gap between the bus bar 32 and the substrate 12. This structure allows the oscillating state or the temperature rise at a plurality of bonded portions to be uniform, reducing variation of the bonding strength and resistance value of the wire. The structure shown in FIG. 6 may be applied to the bus bars (14PR, 14NR, 16U, 16V, or 16W) of the switching circuit 10 of the embodiment according to the invention.

Figure 7A:
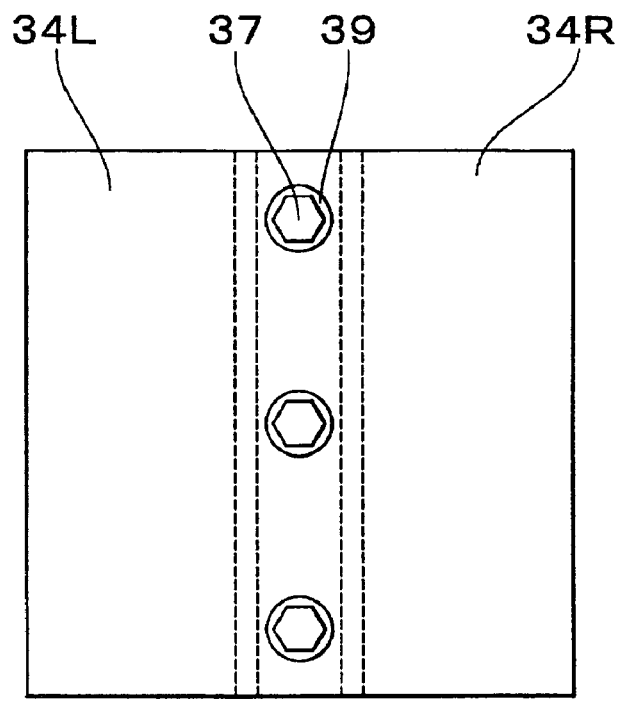
FIGS. 7A and 7B show the bus bars and the insulator of the switching circuit of still further embodiment of the invention.
Figure 7B:
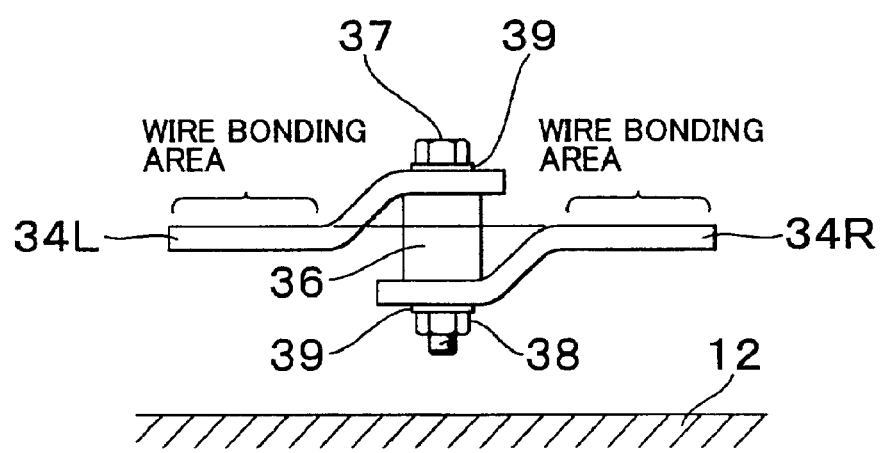
Figure 8:
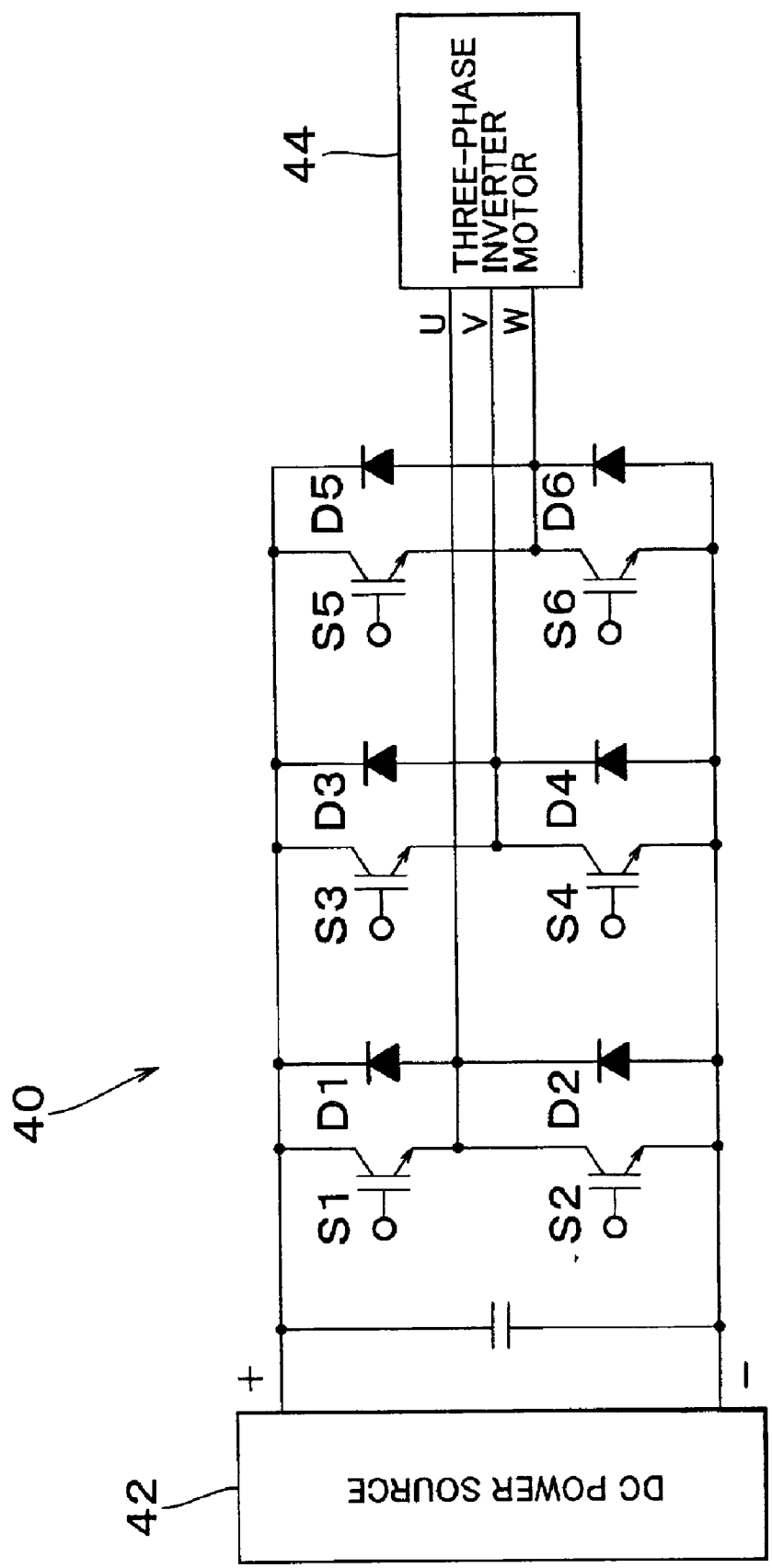
FIG. 8 is a circuit diagram of a conventional switching circuit formed as an inverter.
Figure 9:
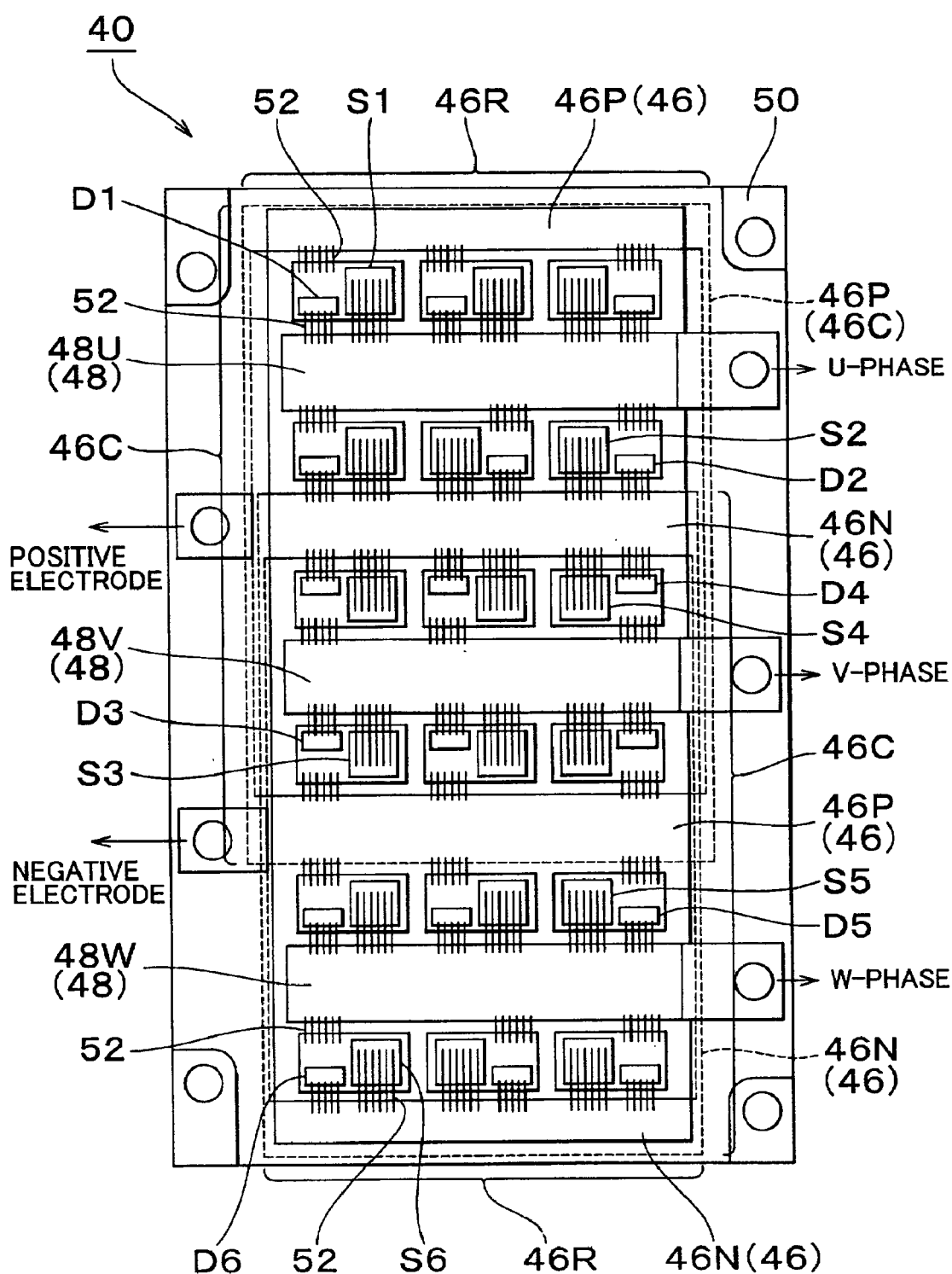
FIG. 9 is a plan view illustrating a whole structure of the conventional switching circuit.

In the aforementioned embodiment, the bus bar 14 has two different portions, the portion subjected to the wire bonding (longitudinal members 14PC, 14NC), and the portion to be stacked via the insulator (14PR, 14NR). Alternatively, the same members of the bus bar may be subjected to wire bonding at a position close to the fixation. FIG. 7A is a plan view showing an example of stacking the 34L and 34R via the insulator 36. FIG. 7B is a sectional view of the bus bars to be fixed via the insulator as shown in FIG. 7A. In this example, the bus bars 34L, 34R are fixed with a bolt 37 and a nut 38 which are inserted through the insulator 36 at a position close to the surface subjected to the wire bonding, that is, the wire bonding area. In this example, a washer 39 formed of an insulating material and a spacer (not shown) formed of the insulating material and inserted into a hole of the bolt that fixes the bus bars 34L and 34R may bring the nut 38 in contact with the bus bars 34L, 34R so as to prevent electric current from flowing between the bus bars 34L and 34R. In this example, the bus bars 34L, 34R are on the same plane, and positioned at the same height from the substrate 12 (the surface on which the switching elements are placed). This structure may allow the wire bonding of the bus bars 34L and 34R to be performed in substantially the same conditions, thus reducing variation in the bonded state of a plurality of positions of the bus bars 34L, 34R. In this example, the bus bars 34L and 34R are bent so as to enhance the second moment of area to bending in the longitudinal direction. As the direction of the electric current flowing through the bus bar 34L is opposite to that of the electric current flowing through the bus bar 34R, the inductance may be reduced. The structure may be realized by combining the aforementioned examples.

The aforementioned embodiment requires no embedding of the bus bars in the resin for insulating purpose. Additionally the embodiment allows enhancement of flexural rigidity and flexural strength, thus making the bus bar further light and compact.

What is claimed is:

1. A switching circuit comprising:
   a plurality of switching elements; and
   a plurality of bus bars each serving as a conductor, the bus bars connecting the switching elements to one of a power source and a load, wherein:
   two or more of the plurality of bus bars are fixed to each other with an insulator interposed between adjacent ones of the two or more bus bars; and
   the two or more of the plurality of bus bars with the insulator interposed therebetween are secured to a substrate of the switching circuit,
   wherein the insulator extends over an overlapped portion of the bus bars to be fixed; and
   wherein the insulator has at least one protruding end portion that extends in a direction perpendicular to the substrate such that the at least one of the bus bars is positioned by the at least one protruding end portion with respect to the insulator.

2. A switching circuit according to claim 1, wherein the switching elements are arranged between the bus bars and connected to the bus bars through wire bonding.

3. A switching circuit according to claim 1, wherein the substrate supports at least one of the bus bars such that a space is formed between the substrate and a wire bonding portion of the at least one of the bus bars.

4. A switching circuit according to claim 1, wherein the two or more of the plurality of the bus bars are fixed with the insulator interposed therebetween such that the insulator extends in a direction parallel with the substrate.

5. A switching circuit according to claim 1, wherein two of the plurality of bus bars are fixed to each other with the insulator interposed therebetween, and wherein current flows in one of the two bus bars in a direction opposite to a direction in which current flows in the other bus bar.

6. A switching circuit comprising:
   a plurality of switching elements; and
   a plurality of bus bars each serving as a conductor, the bus bars connecting the switching elements to one of a power source and a load, wherein;

two or more of the plurality of bus bars are fixed to each other with an insulator interposed between adjacent ones of the two or more bus bars; and the two or more of the plurality of bus bars with the insulator interposed therebetween are secured to a substrate of the switching circuit, wherein the two or more of the plurality of bus bars are fixed with the insulator interposed therebetween such that the insulator extends in a direction perpendicular to the substrate.

7. A switching circuit according to claim 6, wherein the switching elements are arranged between the bus bars and connected to the bus bars through wire bonding.

8. A switching circuit according to claim 6, wherein the substrate supports at least one of the bus bars such that a space is formed between the substrate and a wire bonding portion of the at least one of the bus bars.

9. A switching circuit according to claim 6, wherein the insulator extends over an overlapped portion of the bus bars to be fixed.

* * * * *

UNITED STATES PATENT AND TRADEMARK OFFICE
CERTIFICATE OF CORRECTION

PATENT NO. : 6,884,953 B2 Page 1 of 1
DATED : April 26, 2005
INVENTOR(S) : Yoshihide Nii et al.

It is certified that error appears in the above-identified patent and that said Letters Patent is hereby corrected as shown below:

Title page,
Item [75], Inventors, first inventor should be -- Yoshihide NII --.

Signed and Sealed this

Twenty-seventh Day of September, 2005

JON W. DUDAS
*Director of the United States Patent and Trademark Office*